United States Patent [19]
Jang

[11] Patent Number: 5,495,431
[45] Date of Patent: Feb. 27, 1996

[54] HIGH SPEED TWO'S COMPLEMENTER

[75] Inventor: Hyun S. Jang, Kyoungki-do, Rep. of Korea

[73] Assignee: Hyundai Electronic Industries Co., Ltd., Kyoungki-do, Rep. of Korea

[21] Appl. No.: 234,920

[22] Filed: Apr. 28, 1994

[30]     Foreign Application Priority Data

Apr. 30, 1993 [KR] Rep. of Korea .................. 93-7365

[51] Int. Cl.$^6$ ............................. G06F 7/00; H03M 7/00
[52] U.S. Cl. ........................ 364/715.01; 341/93
[58] Field of Search .................. 364/715.01, 768, 364/769; 341/93

[56]            References Cited

U.S. PATENT DOCUMENTS 4,520,347  5/1985  Campbell, Jr. ................. 341/93
4,709,226  11/1987  Christopher ................. 364/715.01
5,216,424  6/1993  Kouno et al. ................ 341/93

OTHER PUBLICATIONS

Elliot et al. "Two's Complementor or Straight-Through Logic Arrangement", IBM Tech. Discl. Bull. vol. 12, No. 11, Apr. 1970, pp. 1978–1979.

Primary Examiner—Tan V. Mai
Attorney, Agent, or Firm—Gary M. Nath; Nath & Associates

[57]            ABSTRACT

A 2's complementer having a simple circuit arrangement and yet obtaining a high 2's-complementation rate. The 2's complementer includes an inverting circuit for inverting binary data with at least two bits to produce an 1's complement. The 2's complementer also includes an inverter for inverting inverted data resulted from an inversion of the least-significant bit of the 1's-complement data of at least two bits, and at least one exclusive OR gate for comparing bit data to be currently processed with lower-order bit data of at least one bit of the 1's-complement data, and inverting the current bit data when the at least one lower-order bit data has the value of logic-1.

2 Claims, 6 Drawing Sheets

| | complementary speed | transistors per bit |
|---|---|---|
| 2's complementer of prior art | 22.6 | 20 |
| 2's complementer of the invention with conditional incrementer of first embodiment | 5.6 | 14.6 |
| 2's complementer of the invention with conditional incrementer of second embodiment | 6.0 | 9.6 |

Fig. 6

HIGH SPEED TWO'S COMPLEMENTER

BACKGROUND OF THE INVENTION

1. Field of the Invention

The present invention relates to a complementation device employed in an operator part of a digital information processing system, and more particularly to a 2's complementer having a simple circuit arrangement and yet obtaining a high complementation rate.

2. Description of the Prior Art

Generally, a digital information processing system includes an operator part for performing four basic arithmetic operations, i.e., addition, substraction, multiplication, and division, according to the rules of the addition. For the substraction and division operation, the operator part derives complement of a subtrahend to be added to a minuend and complement of a divisor to be added to a dividend.

As such complements, there are 1's complements and 2's complements. The 2's complements are mainly used because they can simplify the process of the substraction and division, as compared to the 1's complements. Such 2's complements are derived by taking the 1's complements of binary data by bits and then adding "1" to each of the 1's complements. Otherwise, 2's complements may be derived by inverting higher-order bits of binary data than the first one of bits having the value of logic-1 on an order-by-order basis starting with the least-significant bit (LSB) and ending with the most-significant bit (MSB). The first method have been hardly used because of its troublesome operation involving the addition of "1" after deriving of 1's complements. The second method have been mainly used because it enables a simple circuit arrangement to be constructed and a rapid operation rate to be obtained.

However, existing 2's complementers utilizing the second method encounter problems that the circuit arrangement becomes more complex and the complement driving rate is gradually reduced as the number of bits of the data to be complemented is increased. This is because the second method is performed on an order-by-order basis starting with the LSB and ending with the MSB. These problems encountered in the conventional 2's complementers utilizing the second method will be described in detail, in conjunction with FIG. 1.

FIG. 1 is a circuit diagram of a conventional 2' complementer. As shown in FIG. 1, the 2' complementer includes four exclusive OR gates 10, 12, 14 and 16 for receiving binary data of 4 bits respectively applied to four input lines 11, 13, 15 and 17, and four AND gates 18, 20, 22 and 24 for receiving an enable signal EN from a control line 19 in common. The first AND gate 18 performs the AND operation between the enable signal EN and a carry signal received from a fifth input line 21. For a complementation, the enable signal EN has the high logic value. The first exclusive OR gate 10 outputs the value of logic-0 to the first output line 23 when LSB data from the first input line 11 has the same logic value as the output from the first AND gate 18. On the contrary, when LSB data from the first input line 11 has a different logic value from the output from the first AND gate 18, the first exclusive OR gate 10 outputs the value of logic-1 to the first output line 23. As a result, the first exclusive OR gate 10 inverts the LSB data when the carry signal has the value of logic-1. On the contrary, when the carry signal has the value of logic-0, the first exclusive OR gate 10 sends the LSB signal, as it is, to the first output line 23.

This 2's complementer further includes a first OR gate 26 for performing the OR operation between the LSB data from the first input line 11 and the carry signal from the fifth input line 21, a second OR gate 28 for performing the OR operation between the second LSB data from the second input line 13 and the output signal from the first OR gate 26, and a third OR gate 30 for performing the OR operation between the second MSB data from the third input line 15 and the output signal from the second OR gate 28.

The second AND gate 20 performs the AND operation between the enable signal EN and the output signal from the first OR gate 26 and supplies the result of the AND operation to the second exclusive OR gate 12. The second exclusive OR gate 12 then compares the output signal from the second AND gate 20 with the second LSB data and supplies the result of the comparison to the second output line 25. When the output signal from the first OR gate 26 has the value of logic-1, the data sent to the second output line 25 has the same logic value as the inverted second LSB data. On the contrary, the data on the second output line 25 has the same logic value as the second LSB data when the output signal from the first OR gate 26 has the value of logic-0.

The third AND gate 22 performs the AND operation between the enable signal EN and the output signal from the second OR gate 28 and supplies the result of the AND operation to the third exclusive OR gate 14. In similar, the fourth AND gate 24 performs the AND operation between the enable signal EN and the output signal from the third OR gate 30 and supplies the result of the AND operation to the fourth exclusive OR gate 16. In similar to the second exclusive OR gate 12, the third exclusive OR gate 14 applies to the third output line 27 the inverted second MSB data or the second MSB data, based on the logic value of the output signal from the second OR gate 28. In similar to the third exclusive OR gate 14, the fourth exclusive OR gate 16 applies to the third output line 27 the inverted MSB data or the MSB data, based on the logic value of the output signal from the third OR gate 30.

In actual, where the 2's complementer receives data having logic values of 0, 0, 1 and 0 via the first to fourth input lines 11, 13, 15 and 17, it generates 2's-complement data having logic values of 1, 1, 1 and 0.

However, since the conventional 2's complementer operates binary data from LSB data to MSB data in a sequential manner, the complementation rate is lowered as the number of bits of the data to be complemented is increased. Furthermore, the conventional 2's complementer encounters the problem that the circuit thereof becomes more complex as the number of bits of the data to be complemented is increased.

SUMMARY OF THE INVENTION

Therefore, an object of the invention is to provide a 2's complementer having a simple circuit arrangement and yet obtaining a high complementation rate.

In accordance with the present invention, this object can be accomplished by providing a 2's complementer comprising an inverting circuit for inverting binary data with at least two bits to produce an 1's complement, inverting means for inverting inverted data resulted from an inversion of the least-significant bit of said 1's-complement data of at least two bits; and at least one comparing means for comparing bit data to be currently processed with lower-order bit data of at least one bit of the 1's-complement data, and inverting said current bit data when said at least one lower-order bit data has a predetermined logic.

BRIEF DESCRIPTION OF THE DRAWINGS

These and other objects, features and advantages of the invention will become more apparent upon a reading of the following detailed specification and drawings, in which:

FIG. 6 is a table illustrating complementary speeds, namely, complementation rates and the number of transistors required per bit for complementation in the conventional 2's complementer and 2's complementers respectively including conditional incrementers according to the first and second embodiments of the present invention.

DETAILED DESCRIPTION OF THE PREFERRED EMBODIMENTS

Figure 1:
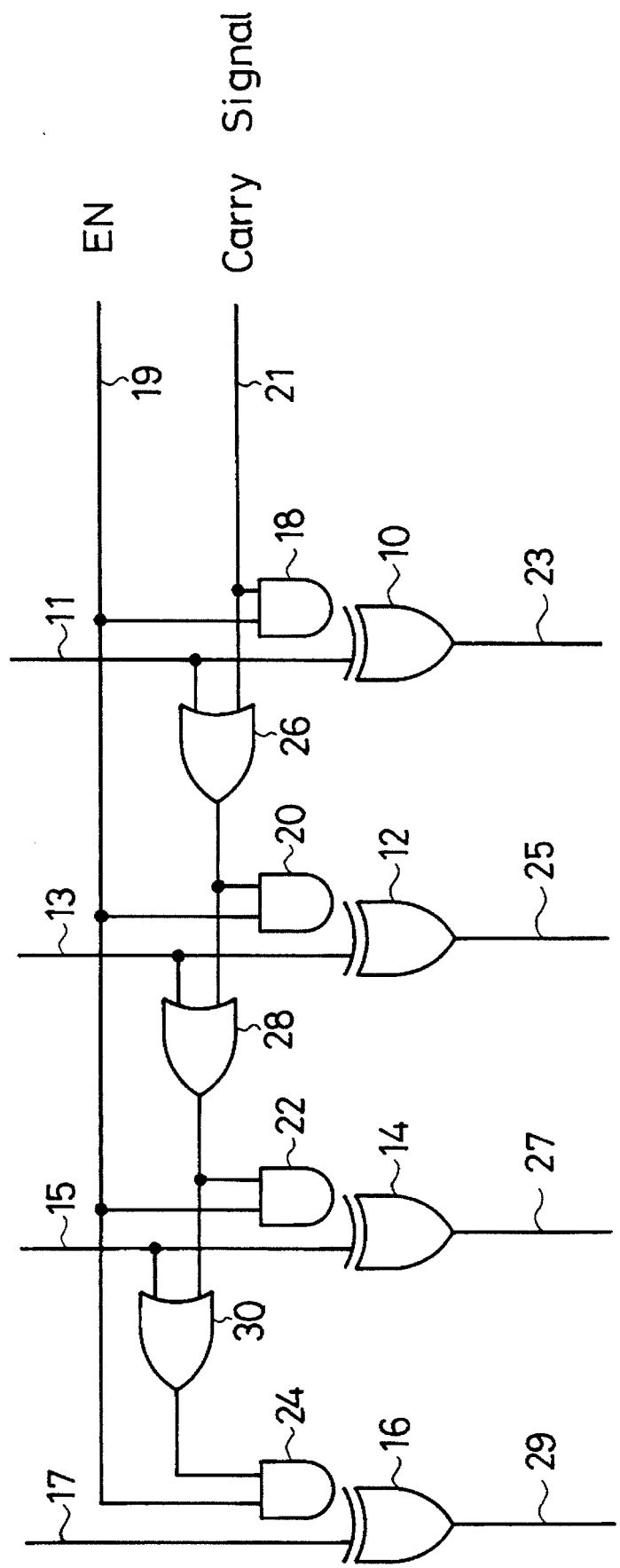
FIG. 1 is a circuit diagram of a conventional 2' complementer.
Figure 2:
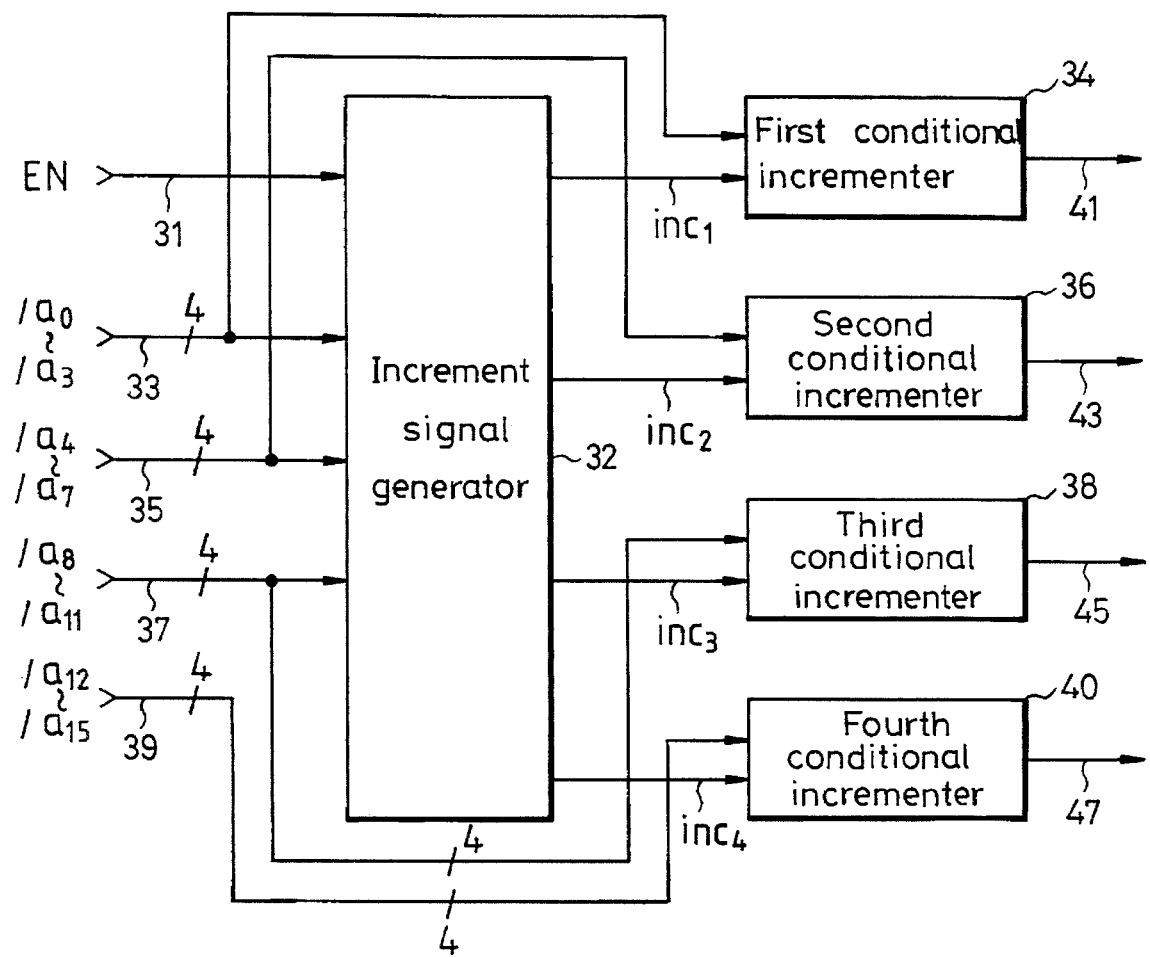
FIG. 2 is a block diagram of a 2's complementer in accordance with the present invention.

FIG. 2 is a block diagram of a 2's complementer in accordance with the present invention. As shown in FIG. 2, the 2's complementer of the present invention includes an increment signal generator 32 for receiving an enable signal EN and 12 inverted data bits $/a_0$ to $/a_{11}$ from three input lines 33, 35 and 37. The increment signal generator 32 combines the received enable signal EN and the 12 inverted data bits $/a_0$ to $/a_{11}$ with one another and thereby generates four increment signals $inc_1$ to $inc_4$.

In accordance with the present invention, the 2's complementer further includes four conditional incrementers 34, 36, 38 and 40 respectively receiving the increment signals $inc_1$ to $inc_4$ from the increment signal generator 32. When the first increment signal $inc_1$ from the increment signal generator 32 has the high logic value, the first conditional incrementer 34 adds "1" to each of the 4 inverted data bits $/a_0$ to $/a_3$ received from the first input line 33 and thereby outputs the resultant added inverted data of 4 bits via the first output line 41. On the contrary, the first conditional incrementer 34 outputs the 4 inverted data bits $/a_0$ to $/a_3$ received from the first input line 33, as they are, to the first output line 41 when the first increment signal $inc_1$ from the increment signal generator 32 has the low logic value.

The second to fourth conditional incrementers 36, 38 and 40 operate in a similar manner as the first conditional incrementer 34. The second conditional incrementer 36 receives the second increment signal $inc_2$ from the increment signal generator 32 and the four inverted data bits $/a_4$ to $/a_7$ from the second input line 35. The third conditional incrementer 38 receives the third increment signal $inc_3$ from the increment signal generator 32 and the four inverted data bits $/a_8$ to $/a_{11}$ from the third input line 37. On the other hand, the fourth conditional incrementer 36 receives the fourth increment signal $inc_4$ from the increment signal generator 32 and four inverted data bits $/a_{12}$ to $/a_{15}$ from the fourth input line 39. The second to fourth conditional incrementers 36, 38 and 40 send, by four bits, the inverted data bits $/a_4$ to $/a_{15}$, as they are, or inverted data bits each resulted from the addition of "1" to each of the inverted data bits $/a_4$ to $/a_{15}$, to the second to fourth output lines 43, 45 and 47, respectively. The 16 inverted data bits $/a_0$ to $/a_{15}$ inputted at the first to fourth input lines 33, 35, 37 and 39 are 1's complements of 16 data bits $a_0$ to $a_{15}$ and generated from an inverting circuit not shown. For simplicity of the illustration, this inverting circuit is not shown in FIG. 2.

Figure 3:
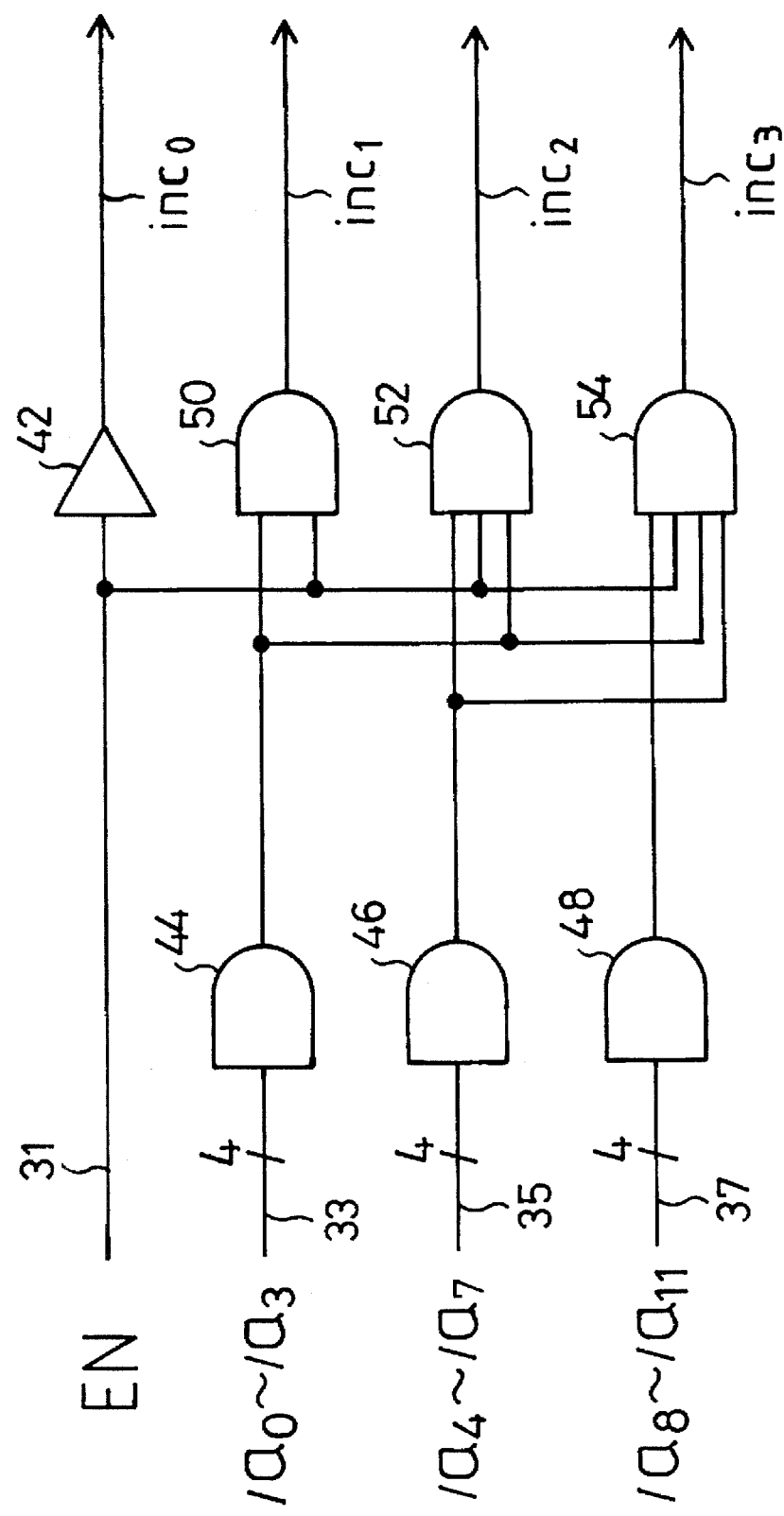
FIG. 3 is a circuit diagram of an increment signal generator shown in FIG. 2.

FIG. 3 is a circuit diagram of the logic of the increment signal generator 32 shown in FIG. 2. As shown in FIG. 3, the increment signal generator 32 includes a buffer 42 adapted to receive an enable signal EN from a control line 31, and three AND gates 44, 46 and 48 respectively coupled to the input lines 33, 35 and 37. The buffer 42 buffers the enable signal EN received from the control line 31 and applies the buffered enable signal EN as the first increment signal $inc_1$ to the first conditional incrementer 34 shown in FIG. 2. The first AND gate 44 performs the AND operation among the inverted data $/a_0$ to $/a_3$ of 4 bits received from the first input line 33. The second AND gate 46 performs the AND operation among the inverted data $/a_4$ to $/a_7$ of 4 bits received from the second input line 35. In similar to the first and second AND gates 44 and 46, the third AND gate 48 performs the AND operation among the inverted data $/a_8$ to $/a_{11}$ of 4 bits received from the third input line 37.

The increment signal generator 32 further includes fourth to sixth AND gates 50, 52 and 54 all adapted to receive the enable signal EN from the control line 31 in common. The fourth AND gate 50 performs the AND operation between the enable signal EN and the output signal from the first AND gate 44 and sends the result of the AND operation as the second increment signal $inc_2$ to the second conditional incrementer 36 shown in FIG. 2. In other words, the fourth AND gate 50 ANDs the enable signal EN and the 4 inverted data bits $/a_0$ to $/a_3$ and supplies the result of the AND operation to the second conditional incrementer 36.

The fifth AND gate 52 performs the AND operation among the enable signal EN and the output signals from the first and second AND gates 44 and 46 and sends the result of the AND operation as the third increment signal $inc_3$ to the third conditional incrementer 38 shown in FIG. 2. The third increment signal $inc_3$ outputted from the fifth AND gate 52 has the high logic value only when all the 8 inverted data bits $/a_0$ to $/a_7$ have the value of logic-1.

The sixth AND gate 54 performs the AND operation among the enable signal EN and the output signals from the first to third AND gates 44, 46 and 48 and sends the result of the AND operation as the fourth increment signal $inc_4$ to the fourth conditional incrementer 40 shown in FIG. 2. The fourth increment signal $inc_4$ outputted from the sixth AND gate 54 has the high logic value only when all the 8 inverted data bits $/a_0$ to $/a_{11}$ applied to the first to third input lines 33, 35 and 37 have the value of logic-1.

Figure 4:
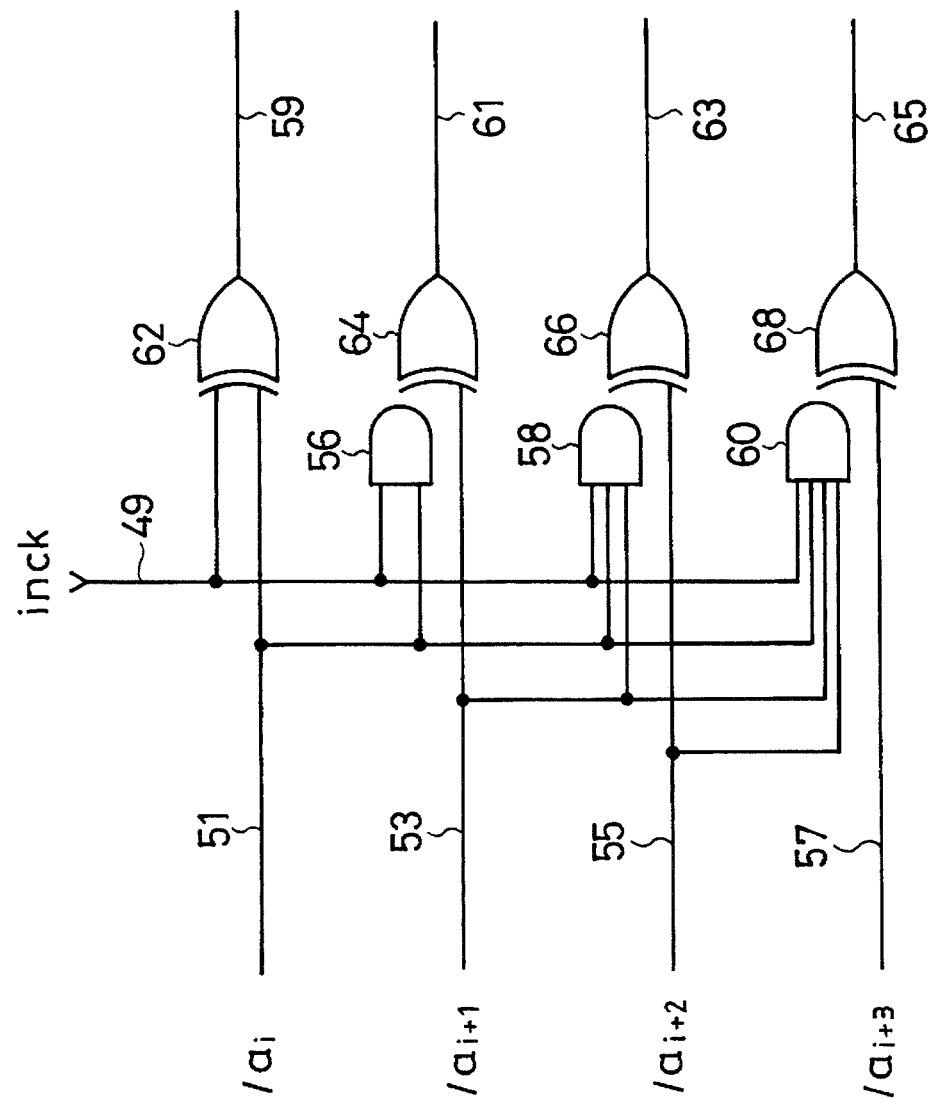
FIG. 4 is a circuit diagram of one of conditional incrementers shown in FIG. 2 in accordance with a first embodiment of the present invention.

FIG. 4 is a circuit diagram of one of the first to fourth conditional incrementers 34, 36, 38 and 40 shown in FIG. 2 in accordance with a first embodiment of the present invention. As shown in FIG. 4, the conditional incrementer includes seventh to ninth AND gates 56, 58 and 60 for receiving an increment signal $inc_k$ from a first input line 49, and a first exclusive OR gate 62 for receiving i-th inverted data $/a_i$ from a second input line 51. The seventh AND gate 56 ANDs the increment signal $inc_k$ and the i-th inverted data $/a_i$ from the second input line 51. The eighth AND gate 58 performs the AND operation among the increment signal $inc_k$, the i-th inverted data $/a_i$ from the second input line 51 and i+1-th inverted data $/a_{i+1}$ from a third input line 53. On the other hand, the ninth AND gate 60 performs the AND operation among the increment signal $inc_k$, the i-th inverted data $/a_i$ from the second input line 51, the i+1-th inverted data $/a_{i+1}$ from the third input line 53 and an i+2-th inverted data $/a_{i+2}$ from a fourth input line 55.

The increment signal $inc_k$ is generated by the AND operation between data $/a_{i-1}$ i−1-th inverted from the LSB data $/a_0$ and the enable signal EN. The increment signal $inc_k$ has the high logic value only when both the i−1-th inverted data $/a_{i-1}$ and the enable signal EN. Here, "i" corresponds to "4k−1" and "k" is a positive integer.

The first exclusive OR gate 62 compares the increment signal $inc_k$ from the first input line 49 and the i-th inverted data $/a_i$ from the second input line 51 with each other and sends the result of the comparison to a first output line 59. When the increment signal $inc_k$ has the high logic value, the output signal from the first exclusive OR gate 62 carries i-th data $a_i$ resulted from an inversion of the i-th inverted data $/a_i$. On the contrary, the output signal from the first exclusive OR gate 62 carries the i-th inverted data $/a_i$ when the increment signal $inc_k$ has the low logic value.

The conditional incrementer further includes second to fourth exclusive OR gates 64, 66 and 68 for receiving the seventh to ninth AND gates 56, 58 and 60, respectively. The second exclusive OR gate 64 compares the output signal from the seventh AND gate 56 with the i+1-th inverted data $/a_{i+1}$ from the third input line 53 and sends the result of the comparison to a second output line 61. When both the i-th inverted data $/a_i$ and the increment signal $inc_k$ have the high logic value, that is, the value of logic-1, the output signal from the second exclusive OR gate 64 carries i+1-th data $a_{i+1}$ resulted from an inversion of the i+1-th inverted data $/a_{i+1}$. On the contrary, the output signal from the second exclusive OR gate 64 carries the i+1-th inverted data $/a_{i+1}$ when both the i-th inverted data $/a_i$ and the increment signal $inc_k$ have not the value of logic-1.

The third exclusive OR gate 66 compares the output signal from the eighth AND gate 58 with the i+2-th inverted data $/a_{i+2}$ from the fourth input line 55 and sends the result of the comparison to a third output line 63. When all the i-th inverted data $/a_i$, the i+1-th inverted data $/a_{i+1}$ and the increment signal $inc_k$ have the value of logic-1, the output signal from the third exclusive OR gate 66 carries i+2-th data $a_{i+2}$ resulted from an inversion of the i+2-th inverted data $/a_{i+2}$. On the contrary, the output signal from the third exclusive OR gate 66 carries the i+2-th inverted data $/a_{i+2}$ when all the i-th inverted data $/a_i$, the i+1-th inverted data $/a_{i+1}$ and the increment signal $inc_k$ have not the value of logic-1.

In similar to the third exclusive OR gate 66, the fourth exclusive OR gate 68 compares the output signal from the ninth AND gate 60 with the i+3-th inverted data $/a_{i+}$ from the fifth input line 57 and sends the results of the comparison to a fourth output line 65. When all the i-th inverted data $/a_i$, the i+1-th inverted data $/a_{i+1}$, the i+2-th inverted data $/a_{i+2}$ and the increment signal $inc_k$ have the value of logic-1, the output signal from the fourth exclusive OR gate 68 carries i+2-th data $a_{i+2}$ resulted from an inversion of the i+3-th inverted data $/a_{i+3}$. On the contrary, the output signal from the fourth exclusive OR gate 68 carries the i+3-th inverted data $/a_{i+}$ when all the i-th inverted data $/a_i$, the i+1-th inverted data $/a_{i+1}$, the i+2-th inverted data $/a_{i+2}$ and the increment signal $inc_k$ have not the value of logic-1.

Where the increment signal $inc_k$ has the high logic value, 4 data bits on the first to fourth output lines 59, 61, 63 and 65 have logic values each resulted from the addition of "1" to each logic value of the 4 inverted data bits $/a_i$ to $/a_{i+}$ applied to the first to fourth input lines 51, 53, 55 and 57, respectively. On the contrary, when the increment signal $inc_k$ has low high logic value, the 4 data bits on the first to fourth output lines 59, 61, 63 and 65 have logic values identical to those of the 4 inverted data bits $/a_i$ to $/a_{i+}$ applied to the first to fourth input lines 51, 53, 55 and 57, respectively.

In actual, where four data bits having logic values of 0, 0, 1 and 1 are applied respectively to the first to fourth input lines 51, 53, 55 and 57 and the increment signal $inc_k$ had the high logic value, four 2's-complement data bits having logic values of 0, 1, 0 and 0 are generated on the first to fourth output lines 59, 61, 63 and 65, respectively.

Figure 5:
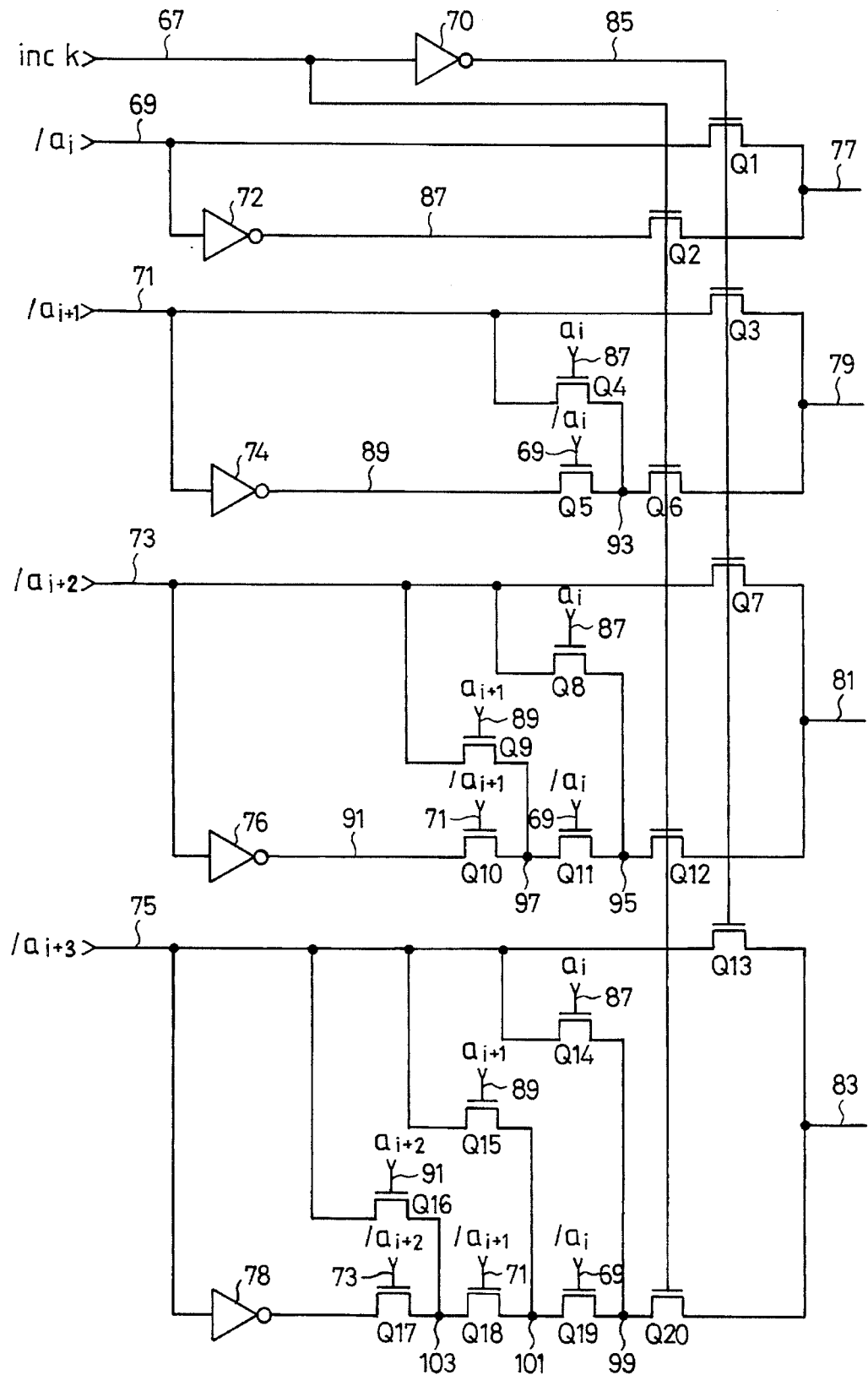
FIG. 5 is a circuit diagram of one of conditional incrementers shown in FIG. 2 in accordance with a second embodiment of the present invention.

FIG. 5 is a circuit diagram of one of the first to fourth conditional incrementers 34, 36, 38 and 40 shown in FIG. 2 in accordance with a second embodiment of the present invention. The conditional incrementer shown in FIG. 5 has a simple logic circuit including reduced number of transistors, as compared with that of FIG. 4.

As shown in FIG. 5, the conditional incrementer includes a first inverter 70 for receiving an increment signal $inc_k$ from a first input stage 67 and a second inverter 72 for receiving i-th inverted data $/a_i$ from a second input stage 69. The first inverter 70 serves to invert the increment signal $inc_k$ received from the first input stage 67 and then send the inverted increment signal $/inc_k$ to the first transmission line 85. The second inverter 70 inverts the i-th inverted data $/a_i$ received from the second input stage 69 and then send the resultant i-th data $a_i$ to the second transmission line 87.

A first field effect transistor (FET) $Q_1$ is coupled between the second input stage 69 and the first output stage 77. A second FET $Q_2$ is coupled between the second transmission line 87 and the first output stage 77. The first FET $Q_1$ transmits the i-th inverted data $/a_i$ from the second input stage 69 to the first output stage 77 when it receives at the gate thereof the high logic value of the inverted increment signal $/inc_k$ from the first transmission line 85. On the other hand, the second FET $Q_2$ transmits the i-th inverted data $/a_i$ from the first input stage 67 to the first output stage 77 when it receives at the gate thereof the high logic value of the increment signal $inc_k$ from the first input stage 67. In other words, the i-th inverted data $/a_i$ or the i-th data $a_i$ is transmitted to the first output stage 77 in accordance with the logic state of the increment signal $inc_k$.

The conditional incrementer of FIG. 5 further includes a third inverter 74 for receiving i+1-th inverted data $/a_{i+1}$ from a third input stage 71 and a third FET $Q_3$ coupled between the third input stage 71 and a second output stage 79. The third inverter 74 serves to invert the i+1-th inverted data $/a_{i+1}$ and then send the resultant i+1-th data $a_{i+1}$ to a third transmission line 89. Between the third transmission line 89 and the second output stage 79, a fifth FET $Q_5$ and a sixth FET $Q_6$ are connected in series. A fourth FET $Q_4$ is coupled between the junction 93 of the fifth and sixth FETs $Q_5$ and $Q_6$ and the third input stage 71.

The third FET $Q_3$ transmits the i+1-th inverted data $/a_{i+1}$ from the third input stage 71 to the second output stage 79 when it receives at the gate thereof the high logic value of the inverted increment signal $/inc_k$ from the first transmission line 85. The fourth FET $Q_4$ transmits the i+1-th inverted data $/a_{i+1}$ from the third input stage 71 to the sixth FET $Q_6$ when it receives at the gate thereof the high logic value of the i-th data $a_i$ from the second transmission line 87. The fifth FET $Q_5$ transmits the i+1-th data $a_{i+1}$ received from the third inverter 74 via the third transmission line 89 to the sixth FET $Q_6$ when it receives at the gate thereof the high logic value of the i-th inverted data /$a_i$ from the second input stage 69. On the other hand, the sixth FET $Q_6$ transmits the i+1-th inverted data /$a_{i+1}$ from the fourth FET $Q_4$ or the i+1-th data $a_{i+1}$ from the fifth FET $Q_5$ when it receives at the gate thereof the high logic value of the increment signal $inc_k$ from the first input stage 67.

Accordingly, the second output stage 79 receives the i+1-th data $a_{i+1}$ when both the increment signal $inc_k$ and the i-th inverted data /$a_i$ have the high logic value. On the contrary, the i+1-th inverted data /$a_{i+1}$ is applied to the second output stage 79 when both the increment signal $inc_k$ and the i-th inverted data /$a_i$ have not the high logic value.

Furthermore, the conditional incrementer of FIG. 5 includes a fourth inverter 76 for receiving i+2-th inverted data /$a_{i+2}$ from a fourth input stage 73 and a seventh FET $Q_7$ coupled between the fourth input stage 73 and a third output stage 81. The fourth inverter 76 inverts the i+2-th inverted data /$a_{i+2}$ and then sends the resultant i+2-th data $a_{i+2}$ to a fourth transmission line 91. Between the fourth transmission line 91 and the third output stage 81, tenth to twelfth FETs $Q_{10}$ to $Q_{12}$ are connected in series. A ninth FET $Q_9$ is coupled between the junction 97 of the tenth and eleventh FETs $Q_{10}$ and $Q_{11}$ and the fourth input stage 73. An eighth FET $Q_8$ is coupled between the junction 95 of the eleventh and twelfth FETs $Q_{11}$ and $Q_{12}$ and the fourth input stage 73.

The seventh FET $Q_7$ transmits the i+2-th inverted data /$a_{i+2}$ from the fourth input stage 73 to the third output stage 81 when it receives at the gate thereof the high logic value of the inverted increment signal /$inc_k$ from the first transmission line 85. The eighth FET $Q_8$ transmits the i+2-th inverted data /$a_{i+2}$ from the fourth input stage 73 to the twelfth FET $Q_{12}$ when it receives at the gate thereof the high logic value of the i-th data $a_i$ from the second transmission line 87. The ninth FET $Q_9$ transmits the i+2-th inverted data /$a_{i+2}$ from the fourth input stage 73 to the eleventh FET $Q_{11}$ when it receives at the gate thereof the high logic value of the i+1-th data $a_{i+1}$ from the third transmission line 89.

The tenth FET $Q_{10}$ transmits the i+2-th inverted data /$a_{i+2}$ from the fourth inverter 76 via the fourth transmission line 91 to the eleventh FET $Q_{11}$ when it receives at the gate thereof the high logic value of the i+1-th inverted data /$a_{i+1}$ from the third input stage 71. The eleventh FET $Q_{11}$ transmits the i+2-th inverted data /$a_{i+2}$ from the ninth FET $Q_9$ or the i+2-th data $a_{i+2}$ from the tenth FET $Q_{10}$ to the twelfth FET $Q_{12}$ when it receives at the gate thereof the high logic value of the i-th inverted data /$a_i$ from the second input stage 69. The twelfth FET $Q_{12}$ receiving at the gate thereof the increment signal $inc_k$ from the first input stage 67 transmits the i+2-th inverted data /$a_{i+2}$ from the eight FET $Q_8$ or the i+2-th data $a_{i+2}$ and i+2-th inverted data /$a_{i+2}$ from the eleventh FET $Q_{11}$ to the third output stage 81 when the increment signal $inc_k$ has the high logic value.

Accordingly, the third output stage 81 receives the i+2-th data $a_{i+2}$ when all the increment signal $inc_k$, the i-th inverted data have the high logic value. On the contrary, the i+2-th inverted data /$a_{i+2}$ is applied to the third output stage 81 when all the increment signal $inc_k$, the i-th inverted data /$a_i$ and the i+1-th inverted data /$a_{i+1}$ have the high logic value.

The conditional incrementer of FIG. 5 further includes a fifth inverter 75 for receiving i+3-th inverted data /$a_{i+}$ from a fifth input stage 75 and a thirteenth FET $Q_{13}$ coupled between the fifth input stage 75 and a fourth output stage 83. The fifth inverter 78 serves to invert the i+3-th inverted data /$a_{i+}$ and then send the resultant i+3-th data $a_{i+}$ to a seventeenth FET $Q_{17}$. Between the seventeenth FET $Q_{17}$ and the fourth output stage 83, eighteenth to twentieth FETs $Q_{18}$ to $Q_{20}$ are connected in series. A sixteenth FET $Q_{16}$ is coupled between the junction 103 of the seventeenth and eighteenth FETs $Q_{17}$ and $Q_{18}$ and the fifth input stage 75. A fifteenth FET $Q_{15}$ is coupled between the junction 101 of the eighteenth and nineteenth FETs $Q_{18}$ and $Q_{19}$ and the fifth input stage 75. A fourteenth FET $Q_{14}$ is coupled between the junction 99 of the nineteenth and twentieth FETs $Q_{19}$ and $Q_{20}$ and the fifth input stage 75.

The thirteenth FET $Q_{13}$ transmits the i+3-th inverted data /$a_{i+}$ from the fifth input stage 75 to the fourth output stage 83 when it receives at the gate thereof the high logic value of the inverted increment signal /$inc_k$ from the first transmission line 85. The fourteenth FET $Q_{14}$ transmits the i+3-th inverted data /$a_{i+}$ from the fifth input stage 75 to the twentieth FET $Q_{20}$ when it receives at the gate thereof the high logic value of the i-th data $a_i$ from the second transmission line 87. The fifteenth FET $Q_{15}$ transmits the i+3-th inverted data /$a_{i+}$ from the fifth input stage 75 to the nineteenth FET $Q_{19}$ when it receives at the gate thereof the high logic value of the i+1-th data $a_{i+1}$ from the third transmission line 89. The sixteenth FET $Q_{16}$ transmits the i+3-th inverted data /$a_{i+}$ from the fifth input stage 75 to the eighteenth FET $Q_{18}$ when it receives at the gate thereof the high logic value of the i+2-th data $a_{i+2}$ from the fourth transmission line 91.

The seventh FET $Q_{17}$ transmits the i+3-th data $a_{i+}$ from the fifth inverter 78 to the eighteenth FET $Q_{18}$ when it receives at the gate thereof the high logic value of the i+2-th inverted data /$a_{i+2}$ from the fourth input stage 73. The eighteenth FET $Q_{18}$ transmits the i+3-th inverted data /$a_{i+}$ from the sixteenth FET $Q_{16}$ or the i+3-th data $a_{i+}$ from the seventeenth FET $Q_{17}$ to the nineteenth FET $Q_{19}$ when it receives at the gate thereof the high logic value of the i+1-th inverted data /$a_{i+1}$ from the third input stage 71. The nineteenth FET $Q_{19}$ transmits the i+3-th inverted data /$a_{i+}$ from the fifteenth FET $Q_{15}$ or one of the i+3-th data $a_{i+}$ and i+3-th inverted data /$a_{i+}$ from the eighteenth FET $Q_{18}$ to the nineteenth FET $Q_{19}$ when it receives at the gate thereof the high logic value of the i-th inverted data /$a_i$ from the second input stage 69. The twentieth FET $Q_{20}$ receiving at the gate thereof the increment signal $inc_k$ from the first input stage 67 transmits the i3-th inverted data /$a_{i+}$ from the fourteenth FET $Q_{14}$ or one of the i+3-th data $a_{i+}$ and i+3-th inverted data /$a_{i+}$ from the nineteenth FET $Q_{19}$ to the fourth output stage 83 when the increment signal $inc_k$ has the high logic value.

Accordingly, the fourth output stage 83 receives the i+3-th data $a_{i+}$ when all the increment signal $inc_k$ and the i-th to i+2-th inverted data /$a_i$ to /$a_{i+2}$ have the high logic value. On the contrary, the i+3-th inverted data /$a_{i+}$ is applied to the fourth output stage 83 when all the increment signal $inc_k$ and the i-th to i+2-th inverted data /$a_i$ to /$a_{i+2}$ have the high logic value.

FIG. 6 is a table illustrating complementary speeds, namely, complementation rates and the number of transistors required per bit in the conventional 2's complementer and 2's complementers respectively including conditional incrementers according to the first and second embodiments of the present invention, where data of 20 bits are to be complemented. As shown in the table of FIG. 6, the 2's complementer including the conditional incrementers shown in FIG. 4 can perform the complementation for the data of 20 bits at a rate corresponding to 4 times the rate of the conventional 2's complementer. This means that the 2' complementer of the first embodiment of the present invention can have a circuit arrangement simplified to ¼ of that of the conventional 2's complementer. The 2's complementer including the conditional incrementers shown in FIG. 5 can perform the complementation for the data of 20 bits at a rate corresponding to about 3.8 times the rate of the conventional 2's complementer. This means that the 2' complementer of the second embodiment of the present invention can have a circuit arrangement simplified to about ½ of that of the conventional 2's complementer.

As apparent from the above description, the present invention provides a 2's complementer capable of simultaneously performing operations for individual bits of 1's complement data in a parallel manner, thereby achieving an improvement in complementation rate and a simpleness in circuit arrangement.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A high speed two's complementer including:

an inverting circuit for inverting n bits of binary data to produce n bits of one's complement data;

an increment signal generating means for generating k bits of increment signals depending on the logic value of n–m bits of complemented data composed of the least significant bit data to the n–$m^{th}$ bit data at the n bits of complement data, said m being an integer, said n being a multiple of the m, and said k being equal to the n divided by the m; and first through $k^{th}$ conditional incrementers for separately receiving by the m bits of data at the n bits of complement data and by a one bit increment signal at the k bit increment signals from the increment signal generating means to selectively add a logic value of "1" to the m bits of complement data in accordance with the logic value of the one bit increment signal, said conditional incrementer comprising:

first exclusive logic-operating means for performing an exclusive logic-operation between the least significant bit data of the m bits of complement data and the one bit increment signal;

first through m–$1^{th}$ AND-operating means for respectively performing an AND-operation of a bit of complement data to be currently processed with lower significant bit complement data of at least one bit; and second through $m^{th}$ exclusive logic-operating means being coupled to the first through m–$1^{th}$ AND-operating means for respectively performing the exclusive logic-operation between the output signal of the AND-operating means and the one bit increment signal.

2. A high speed two's complementer in accordance with claim 1, wherein said first exclusive logic operating means inverts the least significant bit data of the m bit of complement data when the k bit increment signal has a logic value of "1", and each of said second through $m^{th}$ exclusive logic operating means inverts the output signal of said AND operating means in which the k bit increment signal has a logic value of "1".

* * * * *